(12) United States Patent
Tonomura et al.

(10) Patent No.: US 8,050,124 B2
(45) Date of Patent: Nov. 1, 2011

(54) SEMICONDUCTOR MEMORY DEVICE AND METHOD WITH TWO SENSE AMPLIFIERS

(75) Inventors: Yasuko Tonomura, Tokyo (JP); Satoshi Katagiri, Tokyo (JP); Yukio Fuji, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 666 days.

(21) Appl. No.: 12/053,395

(22) Filed: Mar. 21, 2008

(65) Prior Publication Data

US 2008/0247227 A1 Oct. 9, 2008

(30) Foreign Application Priority Data

Apr. 4, 2007 (JP) ................... 2007-097954

(51) Int. Cl.
*G11C 7/00* (2006.01)
(52) U.S. Cl. .................. 365/203; 365/233.11; 365/148; 365/207
(58) Field of Classification Search .................. 365/148, 365/158, 163, 171, 173, 203, 191, 193, 233.1, 365/233.11
See application file for complete search history.

(56) References Cited

U.S. PATENT DOCUMENTS

| | | | |
|---|---|---|---|
| 6,181,620 B1* | 1/2001 | Agata et al. | 365/203 |
| 6,349,054 B1* | 2/2002 | Hidaka | 365/173 |
| 6,426,905 B1* | 7/2002 | Dennard et al. | 365/204 |
| 6,597,626 B2* | 7/2003 | Hirabayashi | 365/233.1 |
| 7,154,788 B2* | 12/2006 | Takemura et al. | 365/189.05 |
| 7,286,429 B1* | 10/2007 | Liaw et al. | 365/209 |

FOREIGN PATENT DOCUMENTS

| | | |
|---|---|---|
| JP | 09-180464 A | 7/1997 |
| JP | 2005-158199 A | 6/2005 |
| JP | 2006-024355 A | 1/2006 |
| JP | 2006-031795 A | 2/2006 |
| JP | 2006-294181 A | 10/2006 |

* cited by examiner

*Primary Examiner* — Anh Phung
*Assistant Examiner* — Lance Reidlinger
(74) *Attorney, Agent, or Firm* — Sughrue Mion, PLLC

(57) ABSTRACT

A semiconductor memory device includes: plural bit lines connected with plural memory cells, respectively; plural transfer lines allocated in common to the plural bit lines; sense amplifiers (SA1) and (SA2) connected to these transfer lines, respectively; and a control circuit making the sense amplifier (SA2) perform a converting operation during an amplifying operation performed by the sense amplifier (SA1). Because the plural sense amplifiers are allocated to the same bit lines, and these are operated in parallel in this way, data can be read at a high speed.

4 Claims, 10 Drawing Sheets

SEMICONDUCTOR MEMORY DEVICE AND METHOD WITH TWO SENSE AMPLIFIERS

TECHNICAL FIELD

The present invention relates to a semiconductor memory device and a control method thereof, and, more particularly relates to a semiconductor memory device having a memory cell capable of performing nondestructive reading and a control method of the semiconductor memory device.

BACKGROUND OF THE INVENTION

At present, various types of semiconductor memory devices are available. Among various types of semiconductor memory devices, a DRAM (Dynamic Random Access Memory) is widely used. Many of DRAMs are of a synchronous type that inputs and outputs data synchronously with a clock signal, and can perform a random access in a cycle of about 7 ns.

However, the DRAM is a volatile memory, and data stored in the DRAM is lost when a power supply is disconnected. Therefore, the DRAM is not suitable to store programs and archival data to be stored in a long term. During a power supply on period, a periodical refresh operation is necessary so as to prevent stored data from disappearing. Therefore, there is a limit to a reduction of power consumption, and a complex control with a controller is necessary.

A flash memory is known as a large-capacity nonvolatile semiconductor memory. However, the flash memory requires a large current to write data or delete data. Further, the flash memory has a disadvantage in that a writing time or a deleting time is very long compared with a DRAM. Therefore, it is inappropriate to use a flash memory as a main memory. While other nonvolatile memories such as an MRAM (Magnetoresistive Random Access Memory) and an FRAM (Ferroelectric Random Access Memory) are also proposed, it is difficult to obtain a memory capacity equivalent to that of the DRAM from these nonvolatile memories.

On the other hand, a PRAM (Phase change Random Access Memory) using a phase-change material as recording material has been proposed as a semiconductor memory replacing the RRAM (see Japanese Patent Application Laid-open Nos. 2006-24355, 2005-158199, 2006-31795, and 2006-294181). The PRAM stores data based on a state of a phase of a phase-change material included in a recording layer. That is, because the phase-change material has a large difference between electric resistance in a crystal phase and electric resistance in an amorphous phase, the phase-change material can store data using this difference.

A phase state is changed by passing a writing current to a phase-change material, thereby heating the phase-change material. On the other hand, a data reading is performed by passing a reading current to the phase-change material, and measuring a resistance value thereof. A reading current is set to a sufficiently smaller value than the writing current to avoid generating a phase change. Therefore, the PRAM can perform nondestructive reading unlike the DRAM. Because the phase state of the phase-change material does not change unless a high heat is applied, data is not lost even when the power supply is disconnected.

Because the DRAM is a semiconductor memory device of a voltage-sensing type, data is read by amplifying a potential difference generated in a bit line pair by a sense amplifier. On the other hand, because the PRAM is a semiconductor memory device of a current-sensing type, in the data reading time, it is necessary to convert the held content to a potential difference by passing a reading current to the memory cell, and further amplify the potential difference.

Therefore, a circuit scale of the sense amplifier of the PRAM is inevitably much larger than that of the sense amplifier of the DRAM. In the PRAM, consequently, it is not reasonable to provide a sense amplifier for each bit line like in the DRAM. Therefore, it becomes necessary to share one sense amplifier with plural bit lines. More realistically, it is considered appropriate to layout one sense amplifier for plural cell arrays.

However, when plural bit lines share one sense amplifier, a capacitance of bit lines from the viewpoint of the sense amplifier becomes very large, and there occurs a problem that a sensing operation takes long time. Therefore, the data reading cycle becomes substantially longer than that of the DRAM, and it becomes impossible to keep compatibility between the PRAM and the DRAM.

This problem similarly occurs not only in the PRAM but also in other types of semiconductor devices taking a long sensing operation.

SUMMARY OF THE INVENTION

It is therefore an object of the present invention to provide a semiconductor memory device capable of reading data at a high speed and a control method thereof.

Another object of the present invention is to provide a semiconductor memory device in which plural bit lines share one sense amplifier, and which can read data at a high speed, and to provide a control method of the semiconductor memory device.

Still another object of the present invention is to provide a semiconductor memory device having a memory cell, which is capable of performing nondestructive reading, and capable of reading data at a high speed, and to provide a control method of the semiconductor memory device.

The above and other objects of the present invention can be accomplished by a semiconductor memory device comprising: a plurality of nondestructively readable memory cells; a bit line connected to the plurality of memory cells; first and second sense amplifiers allocated to the bit line and including a conversion circuit that converts content stored in the memory cells into a potential difference and an amplification circuit amplifying the potential difference; and a control circuit that makes the conversion circuit of the second sense amplifier perform a converting operation during an amplifying operation performed by the amplification circuit of the first sense amplifier.

The above and other objects of the present invention can also be accomplished by a method of controlling a semiconductor memory device including a plurality of nondestructively readable memory cells, bit line connected to the plurality of memory cells, and first and second sense amplifiers allocated to the bit line and including a conversion circuit that converts content stored in the memory cells into a potential difference and an amplification circuit amplifying the potential difference, the method comprising: a first step for performing a converting operation using the conversion circuit of the first sense amplifier; a second step for performing an amplifying operation using the amplification circuit of the first sense amplifier; and a third step for performing a converting operation using the conversion circuit of the second sense amplifier, wherein the second and third steps are performed in parallel.

It is preferable that the memory cells include variable resistance elements having different resistances depending on the stored data. In this case, it is preferable that the conversion circuit includes a reading transistor that supplies a reading current to a selected one of the memory cells. The variable resistance element preferably includes a phase-change material.

According to the present invention, plural sense amplifiers are allocated to the same bit line, and these sense amplifiers are operated in parallel. Therefore, data can be read at a high speed. Consequently, as a result of sharing one sense amplifier among the plural bit lines, even when a sensing operation takes time, the data reading cycle can be shortened. As a result, when the present invention is applied to the PRAM, compatibility between the PRAM and the DRAM can be secured.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
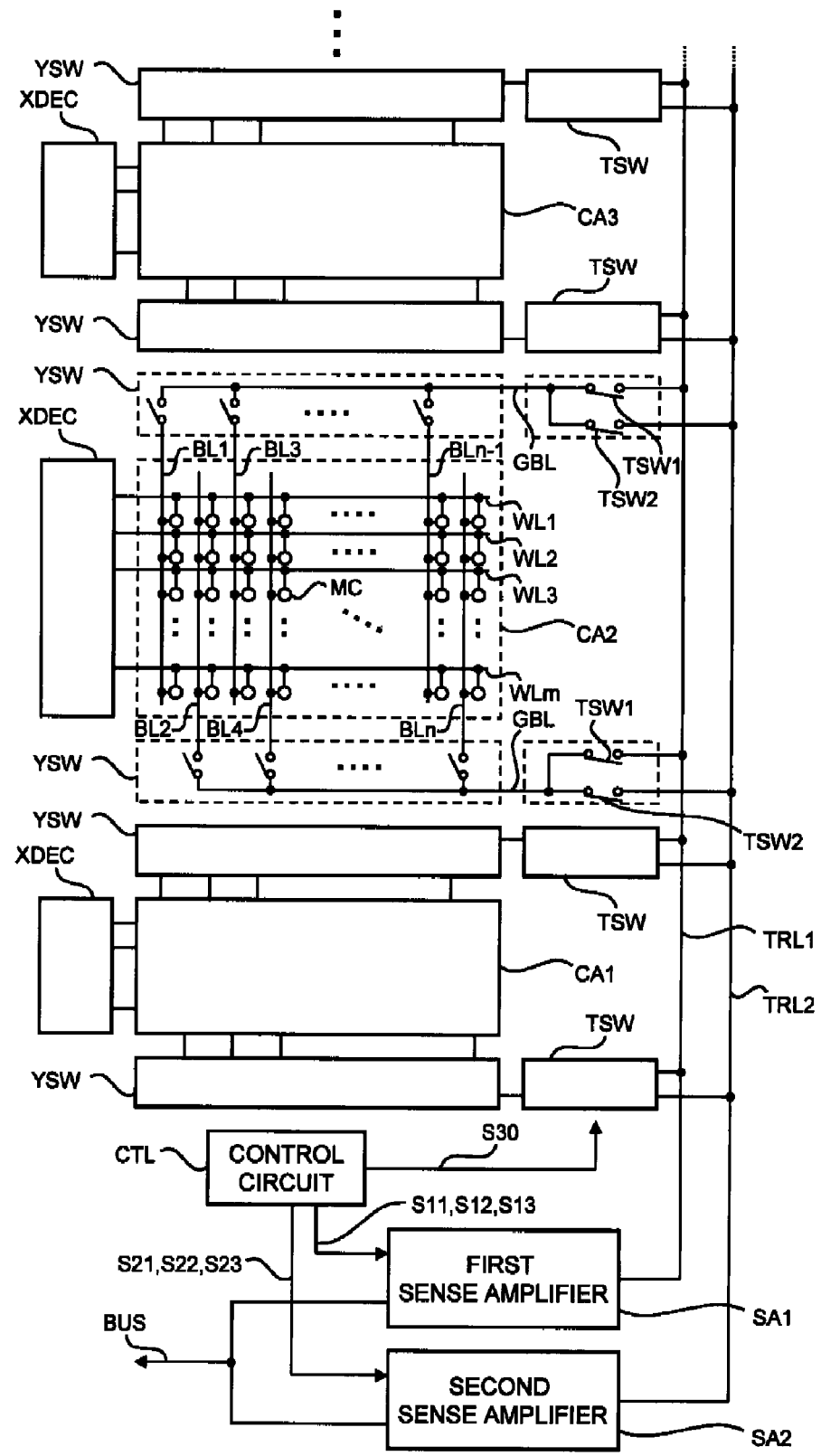
FIG. 1 is a block diagram showing a configuration of a main part of a semiconductor memory device according to an embodiment of the present invention.

FIG. 1 is a block diagram showing a configuration of a main part of a semiconductor memory device according to an embodiment of the present invention. The embodiment shows one example of the application of the present invention to the PRAM.

As shown in FIG. 1, the semiconductor memory device according to the present embodiment includes plural cell arrays CA1, CA2, CA3, . . . , first and second transfer lines TRL1 and TRL2 allocated in common to these plural cell arrays CA1, CA2, CA3, . . . , and first and second sense amplifiers SA1 and SA2 connected to the transfer lines TRL1 and TRL2, respectively.

The cell arrays CA1, CA2, CA3, . . . include plural word lines WL1 to WLm, plural bit lines BL1 to BLn, and memory cells MCs laid out at intersections of the word lines and the bit lines. A row decoder XDEC selects the word lines WL1 to WLm, and at least one of the word lines WL1 to WLm is brought into an active state. The bit lines BL1 to BLn are connected to a global bit line GBL via corresponding Y switches YSW.

Figure 2:
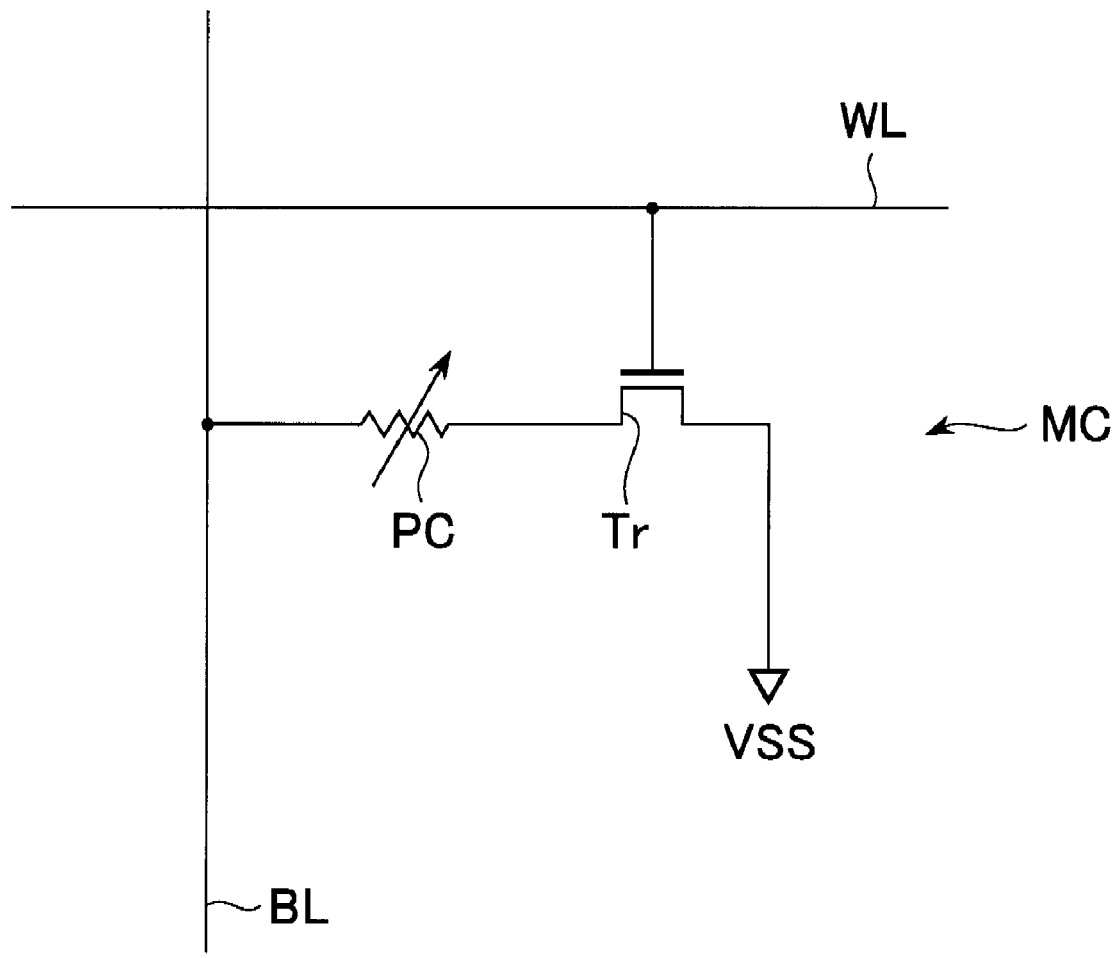
FIG. 2 is a circuit diagram of the memory cell.

FIG. 2 is a circuit diagram of the memory cell MC.

As shown in FIG. 2, the memory cell MC includes a phase-change memory element PC made of a phase-change material, and a selection transistor Tr. The phase-change memory element PC and the selection transistor Tr are connected in series between the bit line BL and a source line VSS.

A phase-change material constituting the phase-change memory element PC is not particularly limited so long as a material having two or more phase states and having different electric resistance depending on the phase state is used. Preferably, a calcogenide material can be selected. The calcogenide material is an alloy containing at least one of germanium (Ge), antimony (Sn), tellurium (Te), indium (In), and selenium (Se). For example, there are binary elements such as GaSb, InSb, InSe, $Sb_2Te_3$, and GeTe, ternary elements such as $Ge_2Sb_2Te_5$, InSbTe, GaSeTe, $SnSb_2Te_4$, and InSbGe, and tetra elements such as AgInSbTe, (GeSn) SbTe, GeSb (SeTe), and $Te_{81}Ge_{15}Sb_2S_2$.

The phase-change material containing the calcogenide material can take either one of an amorphous (noncrystalline) phase and a crystalline phase. The calcogenide material becomes in a relatively high resistance state in the amorphous phase, and becomes in a relatively low resistance state in the crystalline phase.

The selection transistor Tr is a N-channel MOS transistor having a gate electrode connected to a corresponding word line WL. Accordingly, when a word line WL is activated, the phase-change memory element PC becomes in the state of being connected to between a bit line BL and the source line VSS.

In order to amorphasize the phase-change material (reset operation), a writing current is applied to the phase-change material to a melting point or above, and is then cooled rapidly thereafter. On the other hand, in order to crystalize the phase-change material (set operation), a writing current is applied to the phase-change material to heat this material to a temperature equal to or above the crystalization temperature and less than the melting point, and thereafter the temperature is gradually lowered. The writing current is supplied by a writing circuit not shown. Because a data writing operation is not directly relevant to the present invention, explanations about the data writing will be omitted.

Meanwhile, the data reading is performed by connecting the phase-change memory element PC to the bit line BL by turning on the selection transistor Tr, and by passing the reading current in this state. The reading current is set to a sufficiently smaller value than the writing current to avoid the occurrence of a phase change. Therefore, unlike the DRAM, the memory cell MC can perform nondestructive reading. Because the phase state of the phase-change material does not change unless high heat is applied, data is not lost even after the power supply is disconnected. A circuit concerning the data reading and operation of this circuit are described in detail later.

Referring back to FIG. 1, a transfer switch TSW includes a first transfer switch TSW1 connected to a first transfer line TRL1, and a second transfer switch TSW2 connected to a second transfer line TRL2. These transfer switches TSW1 and TSW2 are exclusively turned on in response to a transfer signal S30 supplied from a control circuit CTL. Therefore, when the first transfer switch TSW1 is turned on, a selected memory cell MC is connected to a first sense amplifier SA1, and when the second transfer switch TSW2 is turned on, a selected memory cell MC is connected to a second sense amplifier SA2.

As described above, the transfer lines TRL1 and TRL2 are allocated in common to the plural cell arrays CA1, CA2, CA3, . . . . Therefore, the first and second sense amplifiers SA1 and SA2 are also allocated in common to the plural cell arrays CA1, CA2, CA3, . . . . That is, two systems of reading circuits are provided to the plural cell arrays CA1, CA2, CA3, . . . .

In a general semiconductor memory device such as the DRAM, sense amplifiers are allocated to each bit line pair. Therefore, the sense amplifiers are laid out within the cell array in many cases. In the PRAM, however, in reading data, a reading current needs to be passed to the phase-change memory element PC, thereby converting the content held in the memory cell MC into a potential difference. Further, this potential difference needs to be amplified. As a result, a circuit scale of the sense amplifier of the PRAM becomes much larger than that of the sense amplifier of the DRAM. For the above reasons, in the present embodiment, the sense amplifiers SA1 and SA2 are allocated in common to the plural cell arrays CA1, CA2, CA3, . . . .

Figure 3:
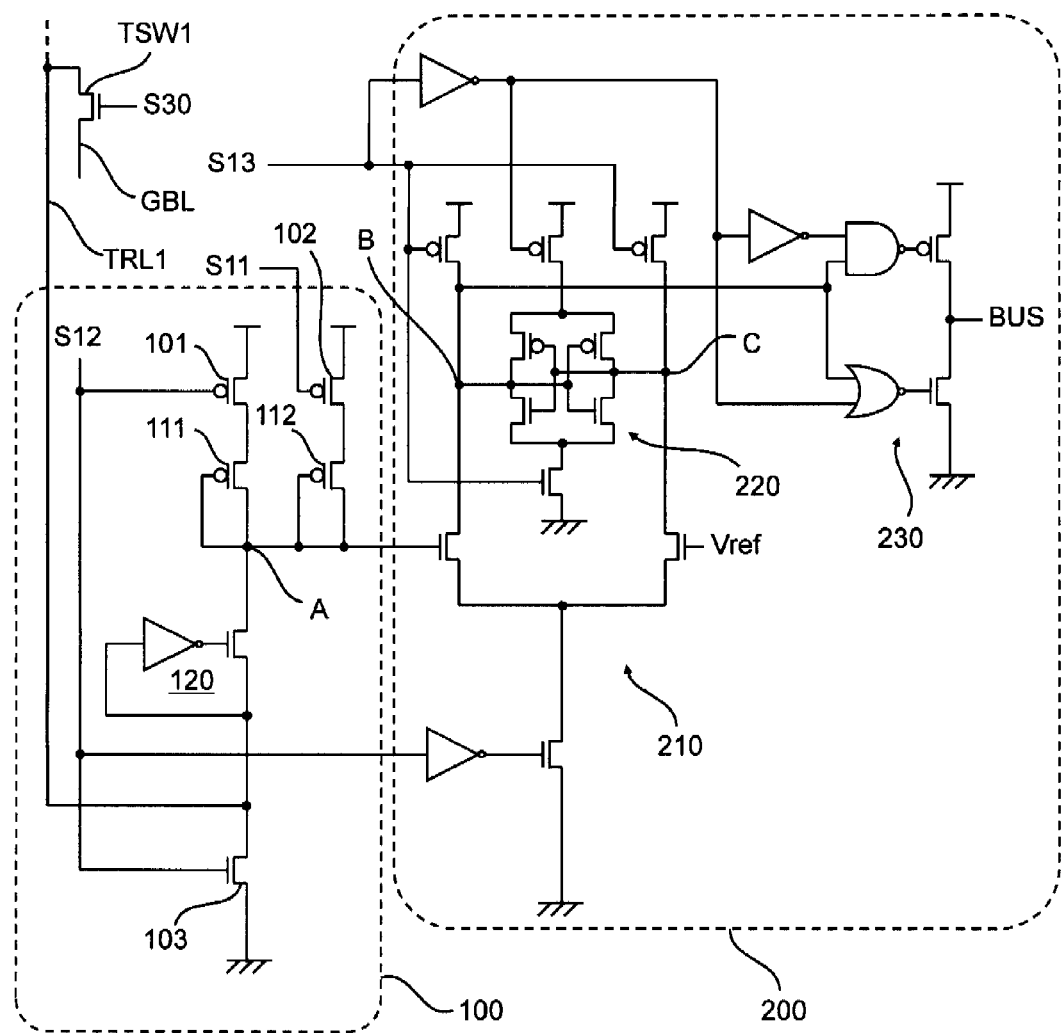
FIG. 3 is a circuit diagram showing the first sense amplifier.

FIG. 3 is a circuit diagram showing the first sense amplifier SA1.

As shown in FIG. 3, the first sense amplifier SA1 includes a conversion circuit 100, and an amplification circuit 200. The conversion circuit 100 is a circuit that converts the content held in the memory cell MC into a potential difference. The amplification circuit 200 is a circuit that amplifies a potential difference generated by the conversion circuit 100.

As shown in FIG. 3, the conversion circuit 100 includes a reading transistor 101 and a precharge transistor 102 connected in parallel between an internal node A and a power supply wiring, and a reset transistor 103 connected between the internal node A and the ground wiring.

The reading transistor 101 is a P-channel MOS transistor, and plays a role of supplying a reading current to the transfer line TRL1 via a P-channel MOS transistor 111 and a current limit circuit 120. The precharge transistor 102 is also a P-channel MOS transistor, and plays a role of precharging the transfer line TRL1 via a P-channel MOS transistor 112 and the current limit circuit 120. The transistors 111 and 112 are diode-connected. This is because a potential of the transfer line TRL1 is decreased to a ground level in the period before the reading, the potential needs to be quickly increased to a readable level. Therefore, the driving capacity of the precharge transistor 102 is designed sufficiently higher than that of the reading transistor 101.

The reset transistor 103 is an N-channel MOS transistor, and plays a role of decreasing the transfer line TRL1 to the ground level after ending the reading.

A precharge signal S11 is supplied to a gate electrode of the precharge transistor 102. Therefore, when a precharge signal S11 becomes at an active level (low level), the transfer line TRL1 is quickly precharged. A sense activation signal S12 is supplied in common to gate electrodes of the reading transistor 101 and the reset transistor 103, respectively. Therefore, when the sense activation signal S12 becomes the active level (low level), a reading current is supplied to the transfer line TRL1. When the sense activation signal S12 becomes the inactive level (high level), the transfer line TRL1 is connected to the ground line.

On the other hand, the amplification circuit 200 includes a differential circuit unit 210, a latch unit 220, and an output circuit 230.

The differential circuit unit 210 is a circuit that compares a potential of the internal node A with a reference potential Vref. When the sense activation signal S11 becomes at the active level, the differential circuit unit 210 performs a comparing operation, and generates a significant potential difference between internal nodes B and C. The latch unit 220 is a circuit that holds an output of the differential circuit unit 210.

When a latch signal S13 becomes at the active level (high level), the latch unit 220 performs a latch operation. Further, the output circuit 230 is a circuit that drives a data bus BUS based on the output of the differential circuit unit 210. When the latch signal S13 becomes at the active level, the output circuit 230 performs an output operation.

The circuit configuration of the first sense amplifier SA1 is explained above. The second sense amplifier SA2 has the same circuit configuration as that of the first sense amplifier SA1 shown in FIG. 3, except that the conversion circuit 100 is connected to the second transfer line TRL2 and that signals S21 to S23 are used instead of the signals S11 to S13.

Figure 4:
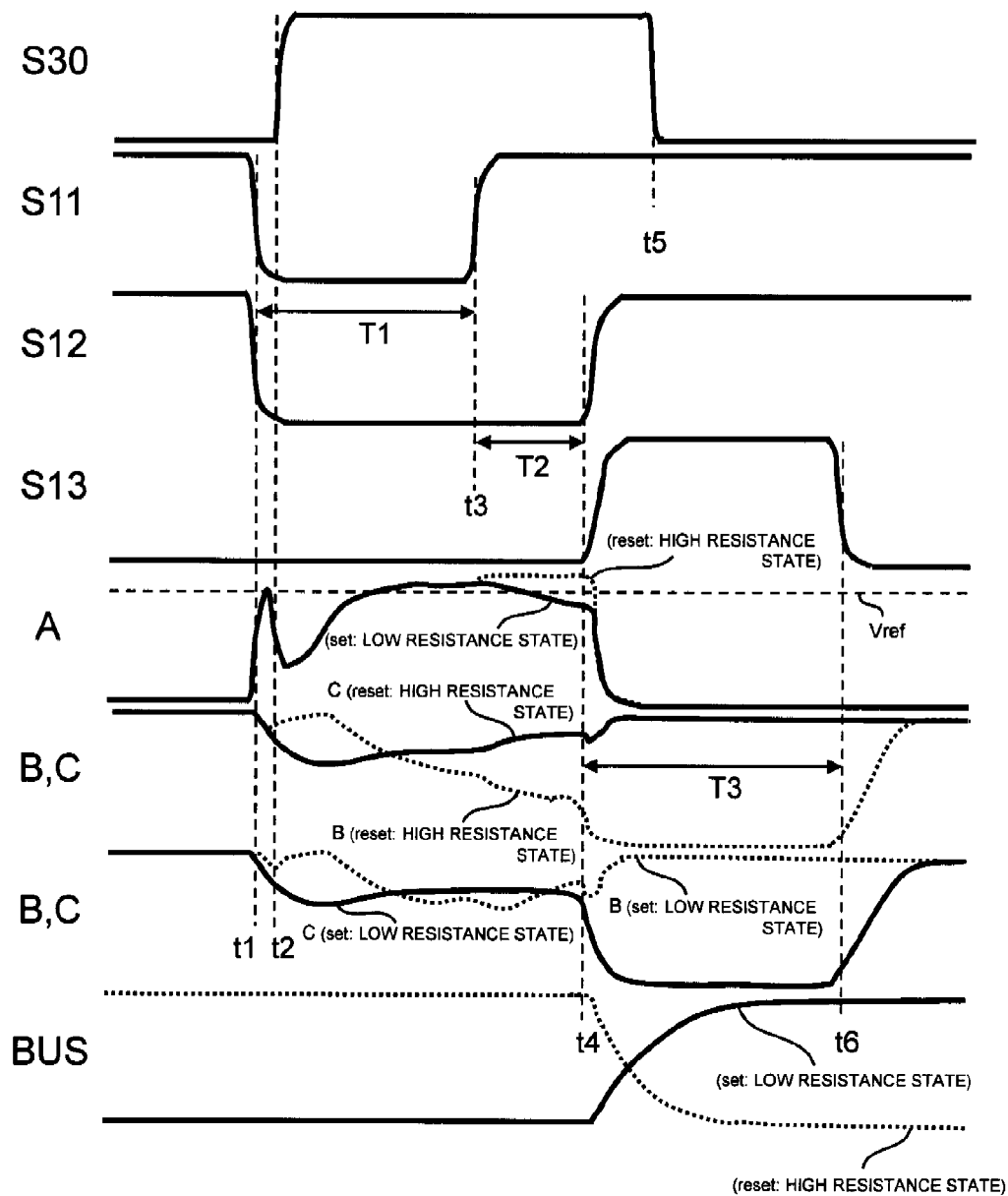
FIG. 4 is a timing diagram for explaining the operation of the first sense amplifier shown in FIG. 3.

FIG. 4 is a timing diagram for explaining the operation of the first sense amplifier SA1.

In the state before the read operation by using the first sense amplifier SA1 (before time t1), both the precharge signal S11 and the sense activation signal S12 are at the high level. Therefore, the reset transistor 103 is turned on, and the transfer line TRL1 is held at the ground level.

When the precharge signal S11 and the sense activation signal S12 are activated at the low level at time t1, the reset transistor 103 is turned off, and the reading transistor 101 and the precharge transistor 102 are turned on. Therefore, the transistor line TRL1 is precharged. As a result, the potential of the internal node A increases near to the reference potential Vref.

Next, at time t2, a predetermined transfer signal S30 is activated. As a result, the first transfer switch TSW1 corresponding to the cell array CA to be read is turned on. Consequently, capacitance of the transfer line TRL1 from the viewpoint of the sense amplifier SA1 increases, and the potential of the internal node A decreases rapidly. However, because the reading transistor 101 and the precharge transistor 102 are in on state, a precharge operation is progressed, and the potential of the internal node A increases to near the reference potential Vref again.

Next, at time t3 when precharge is completed, the precharge signal S11 is inactivated to the high level. The sense activation signal S12 is maintained in the activation state. As a result, a current supplied to the transfer line TRL1 becomes only the reading current via the reading transistor 101.

Therefore, when the memory cell MC to be read is in the high resistance state, that is, when the phase-change memory element PC is in the amorphous state (reset state), the potential of the internal node A becomes higher than the reference potential Vref. On the other hand, when the memory cell MC to be read is in the low resistance state, that is, when the phase-change memory element PC is in the crystal state (set state), the potential of the internal node A becomes lower than the reference potential Vref.

As described above, a predetermined potential difference occurs between the internal node A and the reference potential Vref. Accordingly, the differential circuit unit 210 included in the amplification circuit 200 generates a large potential difference in the internal nodes B and C.

Next, at time t4, the sense activation signal S12 is inactivated to the high level, and the latch signal S13 is activated to the high level. Accordingly, the latch unit 220 included in the amplification circuit 200 increases the potential of one of the internal nodes B and C to the power supply potential, and decreases the potential of the other internal node to the ground level, and this state is maintained. The held information is output to the data bus BUS via the output circuit 230.

After the latch circuit 220 included in the amplification circuit 200 is activated, the read data is held. Therefore, the memory cell MC does not need to be connected to the sense amplifier SA1. Accordingly, at time t5 immediately after time t4, the transfer signal S30 is inactivated.

After the data reading via the data bus BUS is completed, the latch signal S13 is inactivated to the low level at time t6. Accordingly, each signal returns to the state before time t1, and the next reading operation using the same sense amplifier SA1 can be started.

The above explains the operation of the sense amplifier SA1. According to the present embodiment, because the two systems of the sense amplifiers are provided, these two sense amplifiers can be operated in parallel.

Figure 5:
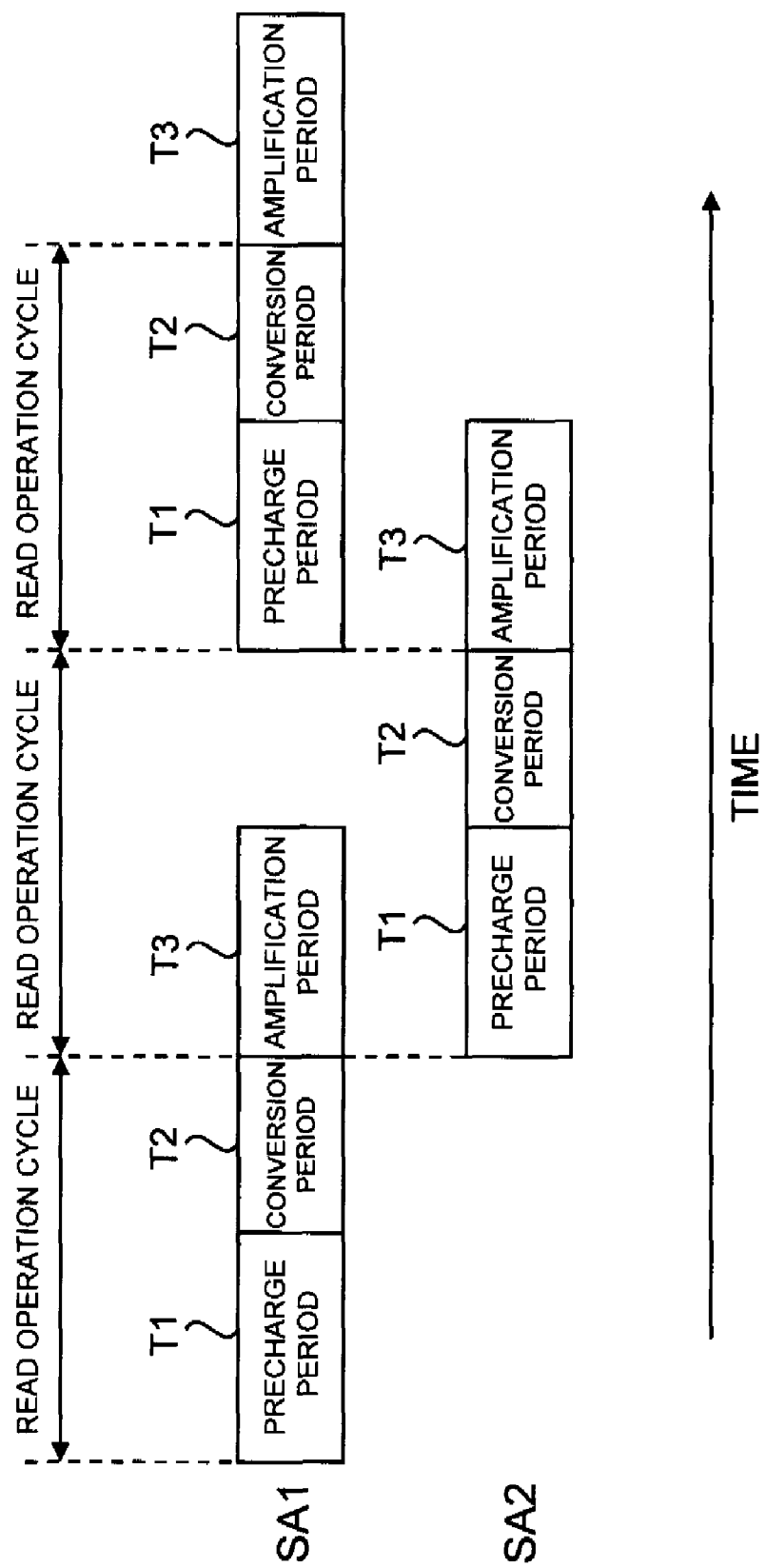
FIG. 5 is a schematic timing diagram for explaining the parallel operation of the sense amplifiers.

FIG. 5 is a schematic timing diagram for explaining the parallel operation of the sense amplifiers SA1 and SA2.

As shown in FIG. 5, the read operation cycle of each of the sense amplifiers SA1 and SA2 includes a precharge period T1, a conversion period T2, and an amplification period T3.

The precharge period T1 is a period of increasing the potential of the transfer line TRL1 or the transfer line TRL2 from the ground level to the precharge level, and corresponds to the period from time t1 to t3 shown in FIG. 4. Therefore, the conversion circuit 100 performs this operation.

The conversion period T2 is a period of converting the content held in the memory cell into a potential difference by passing a reading current to the memory cell MC via the transfer line TRL1 or the transfer line TRL2, and corresponds to the period from time t3 to t4 shown in FIG. 4. Therefore, the conversion circuit 100 also performs this operation.

The amplification period T3 is a period of amplifying a potential difference between the potential of the internal node A and the reference potential Vref, and corresponds to the period from time t4 to t6 shown in FIG. 4. Therefore, the amplification circuit 200 performs this operation.

In the present embodiment, when one of the sense amplifiers enters the amplification period T3, the other sense amplifier starts the reading operation, and can perform the precharge operation and the converting operation. That is, both sense amplifiers can be operated in parallel without waiting for the end of the reading operation of one sense amplifier.

This is because the semiconductor memory device according to the present embodiment is a PRAM capable of performing nondestructive reading of the held content. That is, according to the semiconductor memory device of which held data is destroyed by the data reading (for example, a DRAM), the data needs to be restored after the reading operation is performed. Until when the series of operations are completed, a reading operation cannot be started in the memory cell connected to the same bit line. On the other hand, when the semiconductor memory device can perform nondestructive reading like the PRAM, data does not need to be restored. Therefore, after completing the sensing operation, a reading operation can be performed in the memory cell connected to the same bit line. In the above aspect, the two systems of reading circuits are provided in the present embodiment.

With this arrangement, the reading cycle is substantially defined by the sum of the precharge period T1 and the conversion period T2. As compared with the case of providing only one system of sense amplifier, the reading cycle can be shortened by the amplification period T3. Therefore, when the sum of the precharge period T1 and the conversion period T2 is set to about 7 ns, compatibility with the DRAM can be secured.

According to a semiconductor memory device described in Japanese Patent Application Laid-open No. H9-180464, two sense amplifiers are laid out for a pair of bit lines in DRAM. However, a reading operation cannot be started in other memory cells connected to the same bit line before a series of reading operations including a restoring is completed. This is because the data held in the DRAM is destroyed by the data reading.

As explained above, according to the present embodiment, the first and second sense amplifiers SA1 and SA2 can be operated in parallel. Therefore, even when precharging takes long time because of large capacitance of load from the viewpoint of the sense amplifiers, the reading cycle can be shortened.

Figure 6:
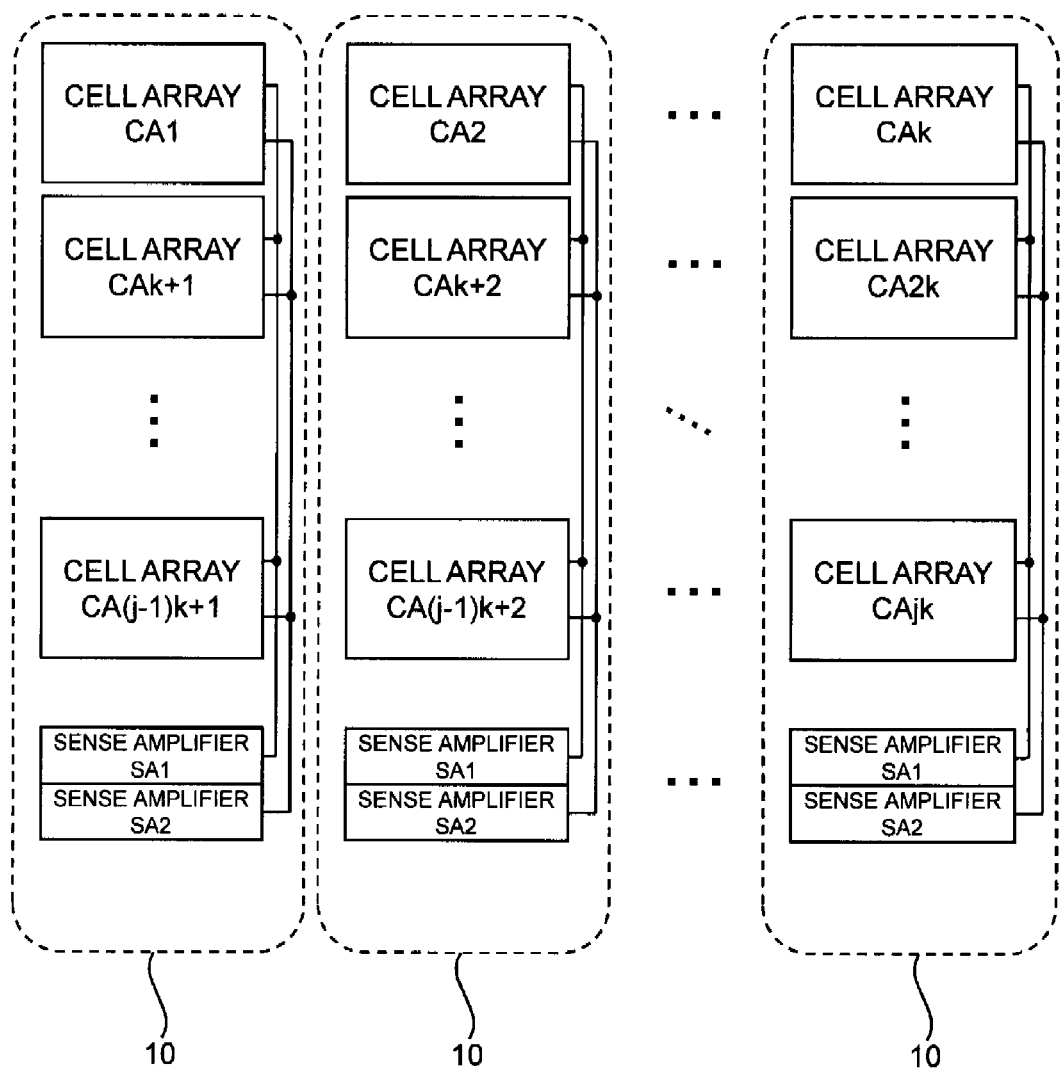
FIG. 6 is a block diagram of a semiconductor memory device having plural unit circuits shown in FIG. 1.

FIG. 6 is a block diagram of a semiconductor memory device having plural unit circuits shown in FIG. 1.

As shown in FIG. 6, when plural unit circuits 10 that is the same circuit shown in FIG. 1 are provided, it is preferable to configure such that the unit circuits 10 different for accesses are selected during a sequential access time. Specifically, when one unit circuit 10 includes j cell arrays and when k unit circuits are provided, these unit circuits can be configured such that cell arrays CA1, CA2, . . . , and CAjk shown in FIG. 6 are accessed in this order during the sequential access operation. Based on this configuration, the same unit circuit is not continuously accessed in the sequential access.

However, when the cell arrays are accessed at random, there is a possibility that the same unit circuit is continuously accessed. In this case, the above parallel operation of two sense amplifiers becomes effective. From this viewpoint, it can be arranged such that two sense amplifiers are operated in parallel only when the same unit circuit is accessed continuously, and only one sense amplifier (for example, the first sense amplifier SAT) is operated at other cases.

Figure 7:
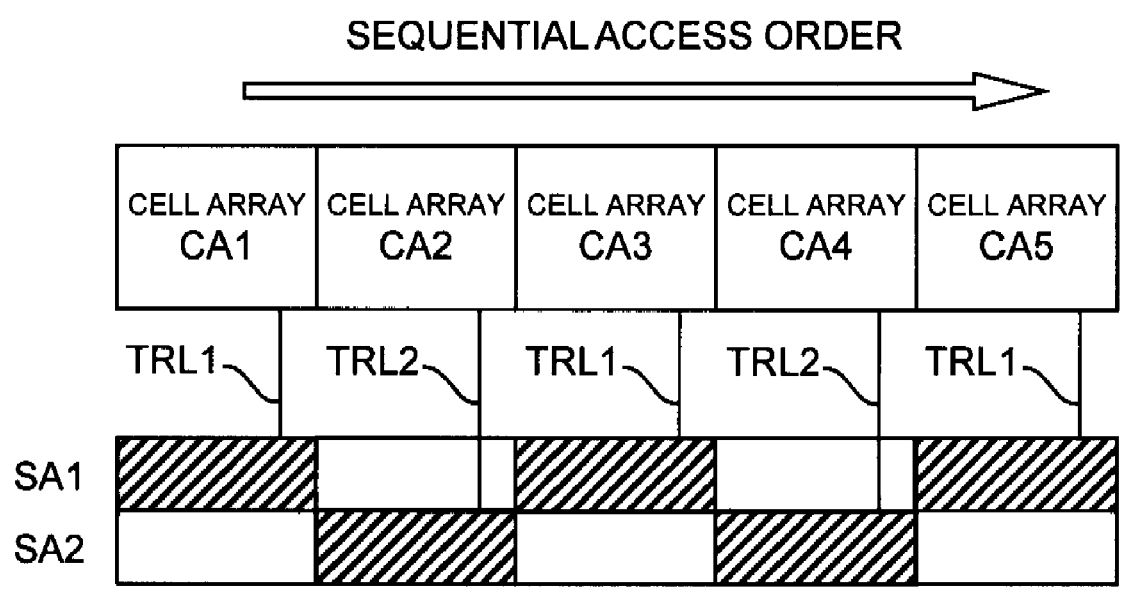
FIG. 7 is a schematic diagram for explaining a state where the first and second sense amplifiers are operated alternately during a sequential access time.

If the operation performed when the same unit circuit is continuously accessed is different from the operation in other cases, there is a risk that the control becomes complex. Considering this, it is preferable that by using two timing signals of mutually different phases, the first sense amplifier SA1 is operated synchronously with a first timing signal, and the second sense amplifier SA2 is operated synchronously with a second timing signal. In this case, as shown in a schematic diagram of FIG. 7, even when a sequential access is performed, the first and second sense amplifiers SA1 and SA2 are operated alternately in adjacent unit circuits. FIG. 7 shows that hatched sense amplifiers are operated.

Figure 8:
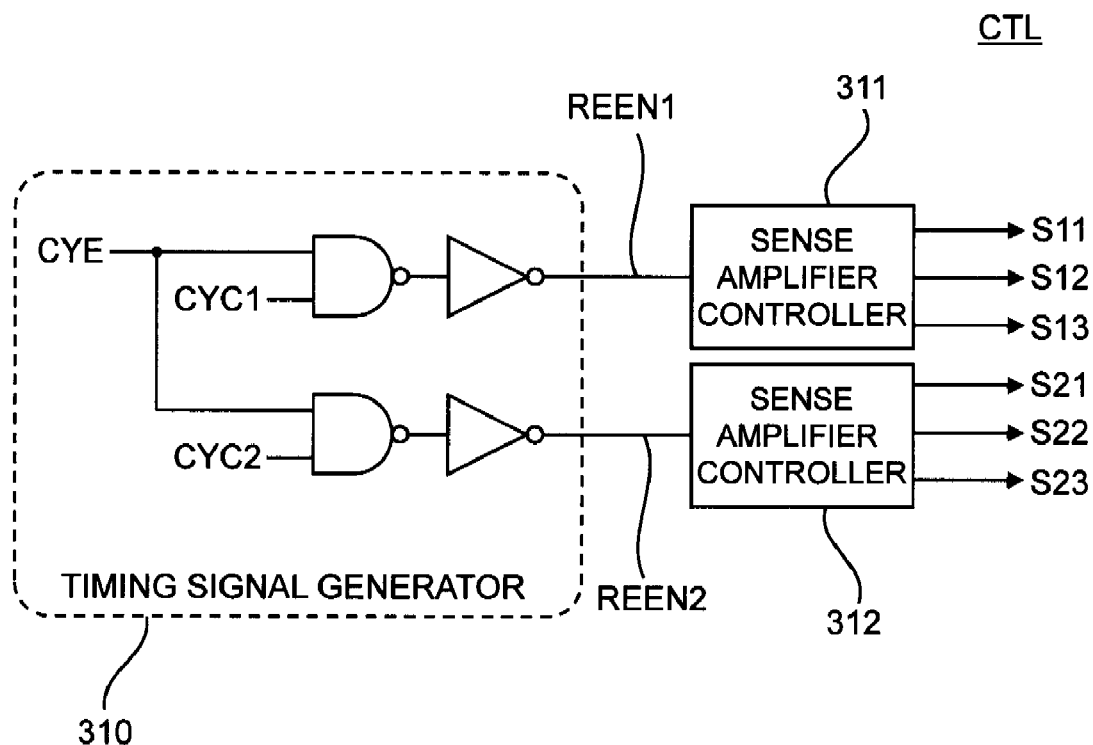
FIG. 8 is a block diagram showing in detail a part of the control circuit.
Figure 9:
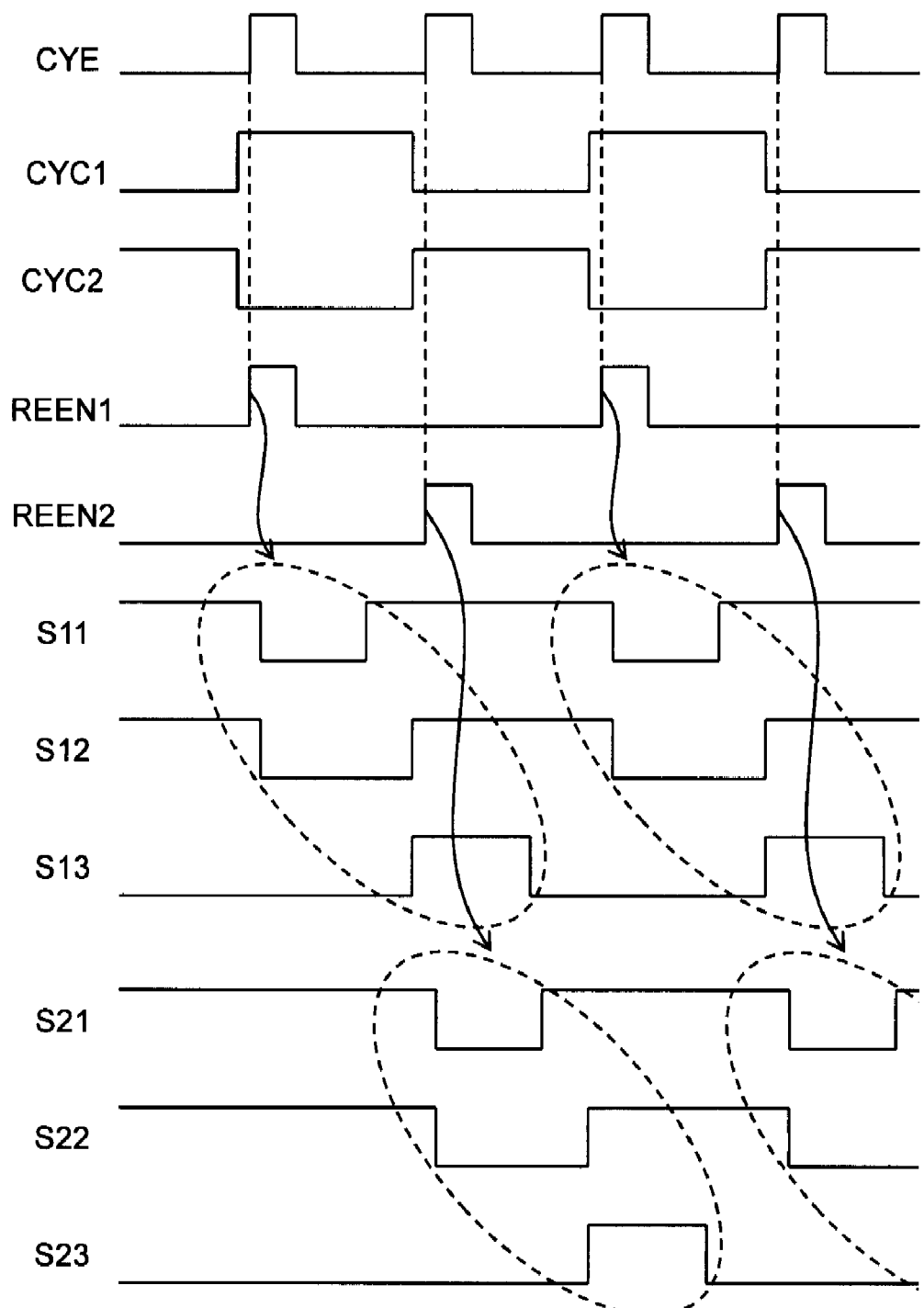
FIG. 9 is a timing diagram showing the operation of the control circuit shown in FIG. 8.

FIG. 8 is a block diagram showing in detail a part of the control circuit CTL. FIG. 9 is a timing diagram showing the operation of the control circuit CTL shown in FIG. 8.

As shown in FIG. 8, the control circuit CTL includes a timing signal generator 310, a first sense amplifier controller 311, and a second sense amplifier controller 312.

The timing signal generator 310 generates first and second timing signals REEN1 and REEN2 having mutually different phases, based on an original signal CYE activated in a constant cycle, and complementary cycle signals CYC1 and CYC2 inverted each time when the original signal CYE is activated.

The first timing signal REEN1 is supplied to the first sense amplifier controller 311, thereby generating the precharge signal S11, the sense activation signal S12, and the latch signal S13, synchronously with the first timing signal REEN1. Similarly, the second timing signal REEN2 is supplied to the second sense amplifier controller 312, thereby generating the precharge signal S21, the sense activation signal S22, and the latch signal S23, synchronously with the first timing signal REEN2.

As explained above, when the first and second sense amplifiers SA1 and SA2 are controlled synchronously with the first and second timing signals REEN1 and REEN2 having mutually different phases, it is not necessary to determine whether the same unit circuit is continuously accessed. Therefore, a circuit configuration can be more simplified.

The present invention is in no way limited to the aforementioned embodiments, but rather various modifications are possible within the scope of the invention as recited in the claims, and naturally these modifications are included within the scope of the invention.

While the application of the present invention to the PRAM is explained as an example in the present embodiment, the application field of the present invention is not limited to this. The present invention can be also applied to other kinds of semiconductor memory devices such as the RRAM. Therefore, in place of the phase-change memory element PC included in the memory cell MC, other nondestructively readable variable resistance element can be also used. It is not essential that the memory cell is nonvolatile, and the memory cell can be volatile.

Figure 10:
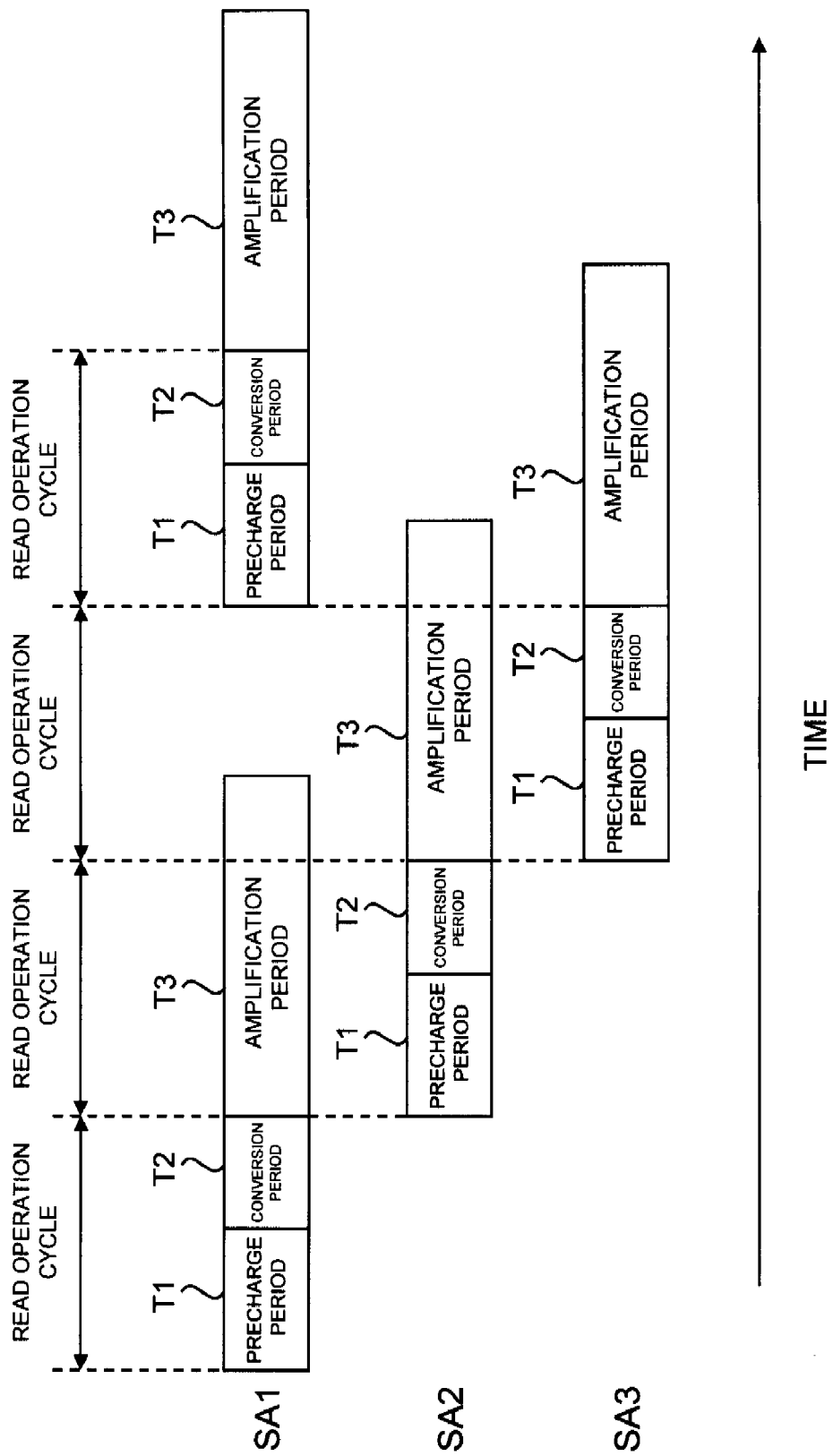
FIG. 10 is an explanatory diagram of an exemplary example that three sense amplifiers are operated in parallel.

While the two sense amplifiers SA1 and SA2 are operated in parallel in the above embodiment, three or more sense amplifiers can be also used in parallel. FIG. 10 is an explanatory diagram of an exemplary example that three sense amplifiers SA1 to SA3 are operated in parallel. As shown in FIG. 10, when the amplification period T3 is longer than the sum of the precharge period T1 and the conversion period T2, the reading cycle cannot be defined by the sum of the precharge period T1 and the conversion period T2, in the two sense amplifiers. In this case, as shown in FIG. 10, when three or more sense amplifiers SA1 to SA3 are used in parallel, the reading cycle can be defined by the sum of the precharge period T1 and the conversion period T2.

What is claimed is:

1. A semiconductor device comprising:
   a plurality of memory cells;
   a plurality of bit lines each coupled to corresponding ones of the memory cells;
   a first sense amplifier having a first terminal, the first sense amplifier charging the first terminal at a first voltage during a first precharge period, the voltage on the first terminal being converted from the first voltage to a first converted voltage responsive to a voltage of a first selected one of the bit lines during a first conversion period, and amplifying the first converted voltage of the first terminal during a first amplification period; and
   a second sense amplifier having a second terminal, the second sense amplifier charging the second terminal at a second voltage during a second precharge period, the voltage on the second terminal being converted from the second voltage to a second converted voltage responsive to a voltage of a second selected one of the bit lines during a second conversion period, and amplifying the second converted voltage of the second terminal during a second amplification period;
   the first amplification period being overlapped at least with the second precharge period,
   wherein the first amplification period is further overlapped with the second amplification period,
   wherein the memory cells include variable resistance elements, respectively.

2. The semiconductor device as claimed in claim 1, wherein the first amplification period is further overlapped with the second conversion period.

3. The semiconductor device as claimed in claim 1, wherein the variable resistance elements include phase-change material, respectively.

4. A semiconductor memory device comprising:
   a plurality of nondestructively readable memory cells;
   a bit line connected to the plurality of memory cells;
   first and second sense amplifiers allocated to the bit line and including a conversion circuit that converts content stored in the memory cells into a potential difference and an amplification circuit amplifying the potential difference; and
   a control circuit that makes the conversion circuit of the second sense amplifier perform a converting operation during an amplifying operation performed by the amplification circuit of the first sense amplifier,
   wherein the control circuit includes a timing signal generator generating a first timing signal and a second timing signal having mutually different phases, a first sense amplifier controller controlling the first sense amplifier synchronously with the first timing signal, and a second sense amplifier controller controlling the second sense amplifier synchronously with the second timing signal.

* * * * *